US012660383B2

(12) United States Patent
Lu

(10) Patent No.: US 12,660,383 B2
(45) Date of Patent: Jun. 16, 2026

(54) DISPLAY PANEL AND METHOD FOR MANUFACTURING THE SAME, DISPLAY APPARATUS

(71) Applicants: Beijing BOE Technology Development Co., Ltd., Beijing (CN); BOE TECHNOLOGY GROUP CO., LTD., Beijing (CN)

(72) Inventor: Zhigao Lu, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 371 days.

(21) Appl. No.: 18/273,300

(22) PCT Filed: Oct. 11, 2021

(86) PCT No.: PCT/CN2021/123006
§ 371 (c)(1),
(2) Date: Jul. 20, 2023

(87) PCT Pub. No.: WO2023/060375
PCT Pub. Date: Apr. 20, 2023

(65) Prior Publication Data
US 2024/0243234 A1 Jul. 18, 2024

(51) Int. Cl.
*H10H 20/851* (2025.01)
*H10H 20/01* (2025.01)
(Continued)

(52) U.S. Cl.
CPC ........ *H10H 20/8512* (2025.01); *H10H 20/01* (2025.01); *H10K 50/15* (2023.02);
(Continued)

(58) Field of Classification Search
CPC .. H10H 20/8512; H10H 20/01; H10H 20/032; H01L 25/0753; H10K 50/15;
(Continued)

(56) References Cited

U.S. PATENT DOCUMENTS

2008/0129192 A1 6/2008 Watanabe et al.
2013/0105780 A1 5/2013 Ohuchi et al.
(Continued)

FOREIGN PATENT DOCUMENTS

CN 102110783 A 6/2011
CN 102460765 A 5/2012
(Continued)

OTHER PUBLICATIONS

WIPO, International Search Report of PCT/CN2022/114545, issued on Oct. 11, 2022.
(Continued)

*Primary Examiner* — Jonathan Han
(74) *Attorney, Agent, or Firm* — HOUTTEMAN LAW LLC

(57) ABSTRACT

The present disclosure provides a display panel and a display apparatus. The display panel includes a first electrode layer, an electron transport layer, a light emitting layer, a hole transport layer, a hole injection layer, and a second electrode layer, which are sequentially stacked, a material of the hole injection layer includes a first metal oxide and a second metal oxide, which contain the same metal element, the number of outermost electrons of the metal element in the first metal oxide is different from the number of outermost electrons of the metal in the second metal oxide. In addition, the hole injection layer further includes a metal M and a third metal oxide MOy, the third metal oxide MOy is formed by an oxidation-reduction reaction between the
(Continued)

metal M and the first metal oxide. The hole injection layer may be of a single layer or a multi-layer structure.

19 Claims, 13 Drawing Sheets

(51) Int. Cl.

| | |
|---|---|
| *H10K 50/15* | (2023.01) |
| *H10K 50/17* | (2023.01) |
| *H10K 71/12* | (2023.01) |
| *H10K 71/60* | (2023.01) |
| *H10K 102/00* | (2023.01) |
| *H10W 90/00* | (2026.01) |

(52) U.S. Cl.
CPC .......... *H10K 50/171* (2023.02); *H10K 71/12* (2023.02); *H10K 71/60* (2023.02); *H10W 90/00* (2026.01); *H10H 20/032* (2025.01); *H10K 2102/351* (2023.02)

(58) Field of Classification Search
CPC ...... H10K 50/171; H10K 71/12; H10K 71/60; H10K 2102/351; H10W 90/00
See application file for complete search history.

(56) References Cited

U.S. PATENT DOCUMENTS

| | | | |
|---|---|---|---|
| 2014/0175411 A1 | 6/2014 | Ohuchi et al. | |
| 2017/0069696 A1 | 3/2017 | Kondo | |
| 2020/0127221 A1* | 4/2020 | Lee ........................ | H10K 50/17 |
| 2021/0020838 A1* | 1/2021 | Qin ........................ | C09K 11/06 |

FOREIGN PATENT DOCUMENTS

| | | | | | |
|---|---|---|---|---|---|
| CN | 102884650 A | | 1/2013 | | |
| CN | 103026523 A | | 4/2013 | | |
| CN | 103053042 A | | 4/2013 | | |
| CN | 103503190 A | | 1/2014 | | |
| CN | 104009161 A | | 8/2014 | | |
| CN | 105789467 A | | 7/2016 | | |
| CN | 106252521 A | | 12/2016 | | |
| CN | 108832012 A | | 11/2018 | | |
| CN | 106816540 B | | 4/2019 | | |
| CN | 109705663 A | | 5/2019 | | |
| CN | 110224070 A | | 9/2019 | | |
| CN | 110224071 A | | 9/2019 | | |
| CN | 110838551 A | | 2/2020 | | |
| CN | 111063811 A | | 4/2020 | | |
| CN | 111697150 A | | 9/2020 | | |
| CN | 111740025 A | | 10/2020 | | |
| CN | 113130835 A | * | 7/2021 | ............. | H10K 50/17 |

OTHER PUBLICATIONS

Jeong et al., "Effective Mg:Ag/MoO3 recombination zone for tandem organic photovoltaic devices," Mater. Res. Soc. Symp. Proc. vol. 1737, 2015.

Dong et al., "Improved Hole Injection Property of Solution-Processed MoO3 with UV-Ozone Treatment," Acta Phys.-Chim. Sin. 2018, 34(11) pp. 1286-1292.

Kao et al., "Improvement of MoO3/Ag/MoO3 multilayer transparent electrodes for organic solar cells by using UV-ozone treated MoO3 layer," Solar Energy Materials and Solar Cells 186 (2018) pp. 131-141.

* cited by examiner

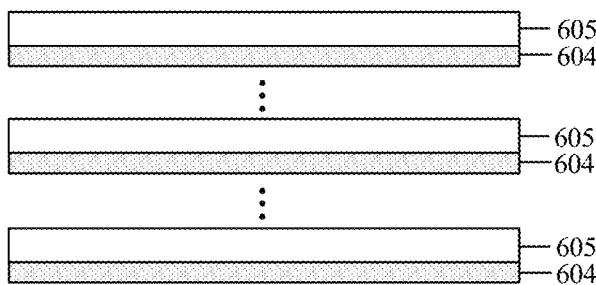
FIG. 6
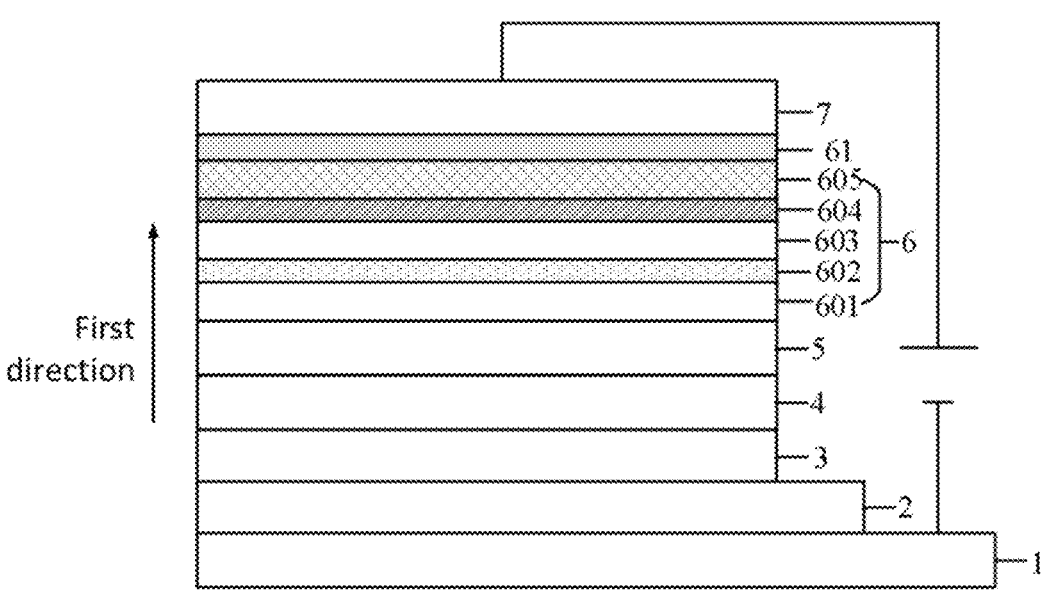
FIG. 7
FIG. 8

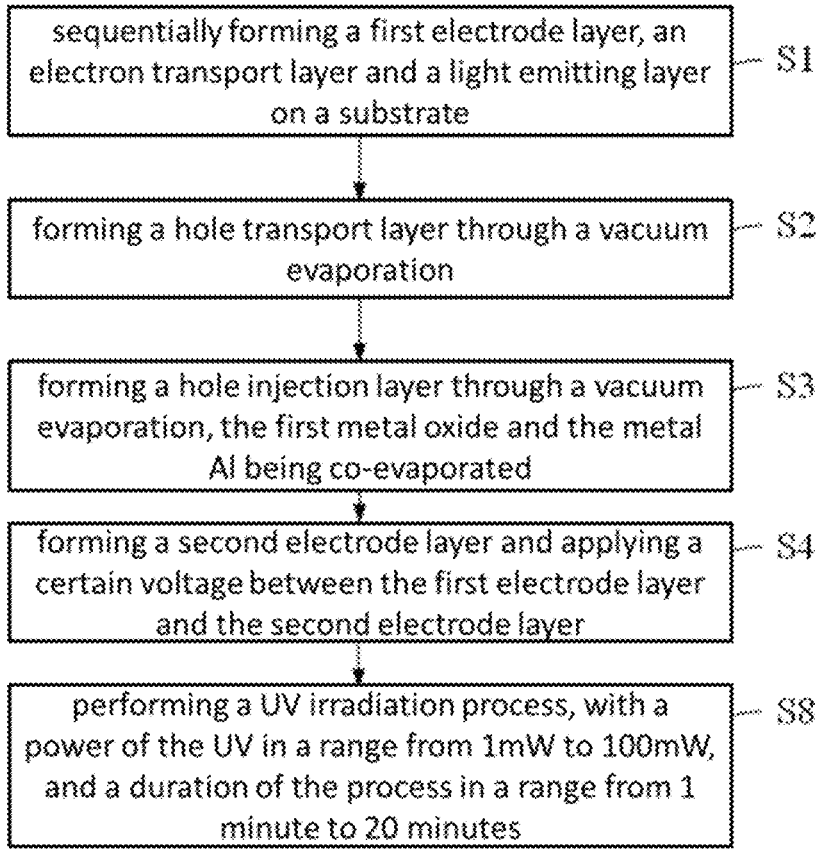

sequentially forming a first electrode layer, an electron transport layer and a light emitting layer on a substrate — S1 forming a hole transport layer through a vacuum evaporation — S2 forming a hole injection layer through a vacuum evaporation, the first metal oxide and the metal Al being co-evaporated — S3 forming a second electrode layer and applying a certain voltage between the first electrode layer and the second electrode layer — S4 performing a UV irradiation process, with a power of the UV in a range from 1mW to 100mW, and a duration of the process in a range from 1 minute to 20 minutes — S8

FIG. 14

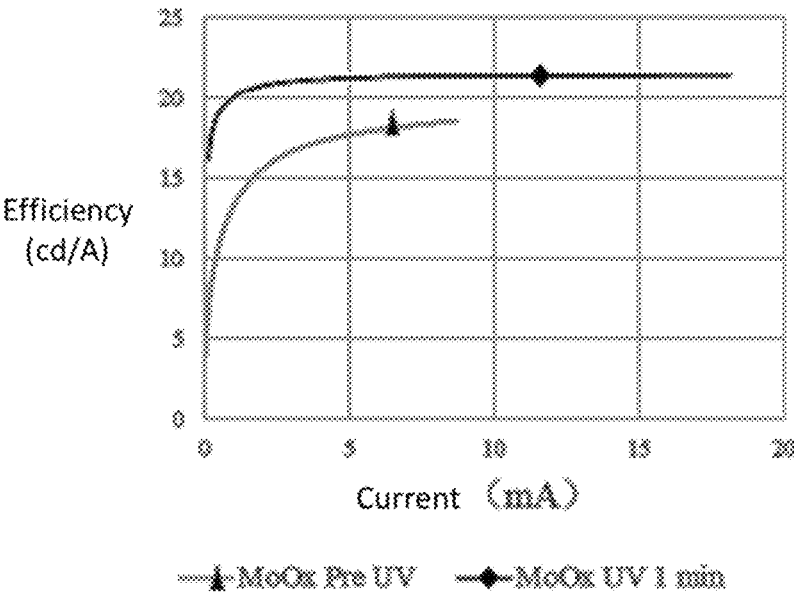

FIG. 15a

DISPLAY PANEL AND METHOD FOR MANUFACTURING THE SAME, DISPLAY APPARATUS

TECHNICAL FIELD

The present disclosure relates to the field of display technology, in particular to a display panel and a display apparatus.

BACKGROUND

A quantum dot light emitting diode (QLED) has the advantages of high color gamut, high color purity, wide viewing angle, long service life, high light emitting efficiency, and the like, and thus exhibits a great potential in the display field and becomes a favorable competitor of the next generation of display technologies. One of the major problems faced by a current quantum dot light emitting diode is the imbalance of carrier injection in the device.

A structure of the typical QLED device includes a cathode, an electron transport layer, a quantum dot light emitting layer, a hole transport layer, a hole injection layer and an anode which are stacked. An interface energy level barrier between a common material of the hole injection layer and the anode is too high, so that the problem of a low rate for the hole injection still exists.

SUMMARY

Embodiments of the present disclosure provide a display panel and a display apparatus including a hole injection layer having an improved material and an improved structure, to improve an interface contact between the hole injection layer and an anode, and improve a display performance of a QLED device.

In a first aspect, an embodiment of the present disclosure provides a display panel, including a first electrode layer, an electron transport layer, a light emitting layer, a hole transport layer, a hole injection layer, and a second electrode layer, which are sequentially stacked; a material of the hole injection layer includes a first metal oxide and a second metal oxide; the first metal oxide and the second metal oxide contain the same metal element, but the number of outermost electrons of the metal element of the first metal oxide is different from the number of outermost electrons of the metal element of the second metal oxide.

In some implementations, the material of the hole injection layer further includes a metal M and a third metal oxide $MO_y$, $0 \le y \le 3$, where y is a natural number or a decimal.

In some implementations, a sum of masses of the metal M and the third metal oxide $MO_y$ is less than a sum of masses of the first metal oxide and the second metal oxide.

In some implementations, a ratio of the mass of the metal M to the mass of the third metal oxide $MO_y$ is in a range from 3:1 to 5:1, a mass percentage of the metal M in the hole injection layer is in a range from 5% to 10%, and a mass percentage of the third metal oxide $MO_y$ in the hole injection layer is in a range from 1% to 5%.

In some implementations, the hole injection layer is a multi-layer structure including a first sub-layer and a second sub-layer sequentially arranged along a first direction and a first reaction layer between the first sub-layer and the second sub-layer, a material of the first sub-layer includes the first metal oxide, a material of the second sub-layer includes the metal M, and a material of the first reaction layer includes the second metal oxide and the third metal oxide $MO_y$.

In some implementations, the hole injection layer further includes n sub-layers and n reaction layers alternatively arranged between the second sub-layer and the second electrode layer, the sub-layers are successively arranged at intervals, the reaction layers are successively arranged at intervals, the second sub-layer is closer to one of the n reaction layers than the n sub-layers, and n is greater than or equal to 0 and is an integer.

In some implementations, a material of the n sub-layers includes a metal and a metal oxide, but is different from materials of the first sub-layer and the second sub-layer; a material of the n reaction layers includes a metal oxide, but is different from the material of the first reaction layer.

In some implementations, the sub-layers include different materials and the reaction layers include different materials.

In some implementations, the first reaction layer has a roughness less than that of the first sub-layer, and each of the n reaction layers has a roughness less than that of the sub-layers.

In some implementations, the metal element in the first metal oxide has a chemical activity lower than that of the metal M.

In some implementations, the first reaction layer is formed by an oxidation-reduction reaction between the first sub-layer and the second sub-layer, and each of the n reaction layers is formed by an oxidation-reduction reaction between the sub-layers adjacent to the reaction layer.

In some implementations, the metal element in the first metal oxide includes at least one of molybdenum, vanadium, or tungsten, the metal M includes at least one of magnesium, aluminum, copper or silver.

In some implementations, the first electrode layer is a cathode and the second electrode layer is an anode; or the first electrode layer is an anode and the second electrode layer is a cathode; and each of the first electrode layer and the second electrode layer is made of at least one of silver, aluminum, indium tin oxide, or carbon nanotubes.

In some implementations, a ratio of a thickness of the first sub-layer and a thickness of the second sub-layer is in a range from 2:1 to 10:1.

In some implementations, the first sub-layer has a thickness in a range from 5 nm to 10 nm, the second sub-layer has a thickness in a range from 1 nm to 5 nm, and the first reaction layer has a thickness in a range from 1 nm to 2 nm, the hole injection layer has a thickness in a range from 5 nm to 31 nm.

In some implementations, the first reaction layer has a carrier mobility greater than that of the first sub-layer.

In a second aspect, an embodiment of the present disclosure provides a display apparatus, including the above display panel.

In a third aspect, an embodiment of the present disclosure provides a method for manufacturing a display panel, including: providing a substrate, and sequentially forming a first electrode layer, an electron transport layer, a light emitting layer, a hole transport layer, a hole injection layer and a second electrode layer on the substrate, a material of the hole injection layer including a first metal oxide and a metal M; and applying a voltage between the first electrode layer and the second electrode layer, so that an oxidation-reduction reaction occurs between the first metal oxide and the metal M to form a second metal oxide and a third metal oxide, the second metal oxide and the third metal oxide being in the hole injection layer, and the voltage being an operating voltage of the display panel.

In some implementations, after the voltage is applied between the first electrode layer and the second electrode layer, a UV irradiation process is performed on the display panel, so that the oxidation-reduction reaction between the first metal oxide and the metal M is promoted, a power of the UV being in a range from 1 mW to 100 mW, and a duration of the UV irradiation process being in a range from 1 minute to 20 minutes.

In some implementations, the forming the hole injection layer includes: depositing the first metal oxide and the metal M on the hole transport layer by co-evaporation, the metal M, the second metal oxide, and the third metal oxide being uniformly distributed in the first metal oxide.

In some implementations, the forming the hole injection layer includes: depositing the metal M as a metal nanowire on the hole transport layer by spin-coating; and depositing the first metal oxide on a side of the metal M away from the hole transport layer by spin-coating.

The embodiments of the present disclosure can achieve the following technical effects: the hole injection layer provided by the embodiments of the present disclosure includes multiple components, and an oxidation-reduction reaction occurs in the hole injection layer under a certain condition, so that the interface contact between the hole injection layer and the anode is improved, and the carrier transmission rate at the interface between the hole injection layer and the anode is increased. Further, since the metal is added into the hole injection layer, a transverse current of the hole injection layer is greater, that is, the electric conduction and the heat conduction of the device are more uniform, thereby improving the light emitting efficiency of the device, reducing the power consumption and improving the service life.

BRIEF DESCRIPTION OF DRAWINGS

To more clearly illustrate the technical solutions of the embodiments of the present disclosure, the drawings of the embodiments will be briefly introduced below. It is apparent that the drawings in the following description only relate to some embodiments of the present disclosure and do not limit the present disclosure.

FIG. 6 is a schematic diagram of an exemplary implementation of a hole injection layer including a plurality of sub-layers and a plurality of reaction layers in the embodiment shown in FIG. 5.

FIG. 7 is a schematic diagram of a structure of a display panel according to an exemplary embodiment of the present disclosure.

FIG. 8 is a schematic diagram of an exemplary implementation of a hole injection layer including a plurality of sub-layers and a plurality of reaction layers in the embodiment shown in FIG. 7.

FIG. 14 is a flowchart of a method for manufacturing a display panel according to an exemplary embodiment of the present disclosure.

FIG. 15a is a comparison graph for a relationship between a current and a device efficiency of a display panel before and after a UV irradiation process according to an exemplary embodiment of the present disclosure.

Figure 1:
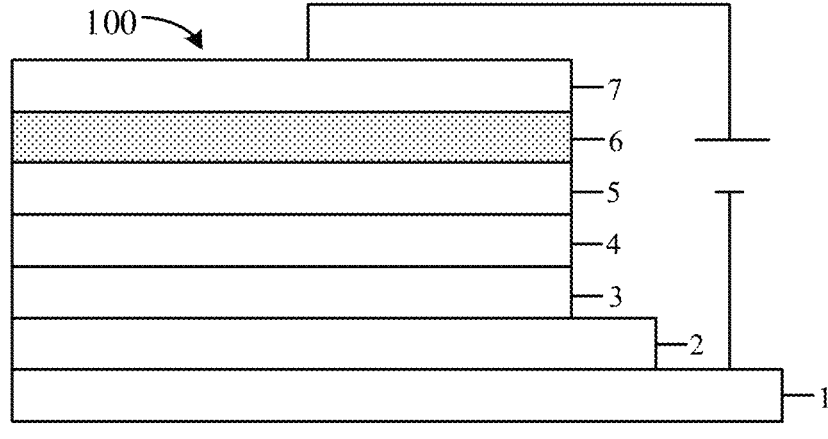
FIG. 1 is a schematic diagram of a structure of a display panel according to an exemplary embodiment of the present disclosure.

Reference sings: 100—display panel; 1—substrate; 2—first electrode layer; 3—electron transport layer; 4—light emitting layer; 5—hole transport layer; 6—hole injection layer; 7—second electrode layer; 9—bank;

61—second reaction layer; 81—metal M; 82—third metal oxide; 83—second metal oxide; 84—first metal oxide; 601—first sub-layer; 602—first reaction layer; 603—second sub-layer; 604—reaction layer; 605—sub-layer; 110—first light emitting structure; 120—second light emitting structure; 130—third light emitting structure; 211—first electrode layer of first light emitting structure; 212—first electrode layer of second light emitting structure; 213—first electrode layer of third light emitting structure; 311—electron transport layer of first light emitting structure; 312—electron transport layer of second light emitting structure; 313—electron transport layer of third light emitting structure; 411—light emitting layer of first light emitting structure; 412—light emitting layer of second light emitting structure; 413—light emitting layer of third light emitting structure; 511—hole transport layer of first light emitting structure; 512—hole transport layer of second light emitting structure; 513—hole transport layer of third light emitting structure; 611—hole injection layer of first light emitting structure; 612—hole injection layer of second light emitting structure; 613—hole injection layer of third light emitting structure; 711—second electrode layer of first light emitting structure; 712—second electrode layer of second light emitting structure; 713—second electrode layer of third light emitting structure.

DETAIL DESCRIPTION OF EMBODIMENTS

The exemplary embodiments will be described here in detail and the examples of the exemplary embodiments are illustrated in the drawings. The following description refers to the drawings in which the same number in different drawings represents the same or similar elements unless otherwise indicated. The exemplary embodiments described below do not represent all embodiments consistent with the present disclosure. Rather, they are merely examples of an apparatus and a method consistent with certain aspects of the present disclosure, as defined in the appended claims.

The terms used in the present disclosure are for the purpose of describing particular embodiments only and are not intended to be limiting of the present disclosure. As used in the present disclosure and the appended claims, singular forms "a/an", "said", and "the" are intended to include the plural forms as well, unless the context clearly indicates otherwise. It should also be understood that the term "and/or" as used herein refers to and encompasses any and all possible combinations of one or more of the associated listed items.

It is to be understood that terms "first", "second", "third", or the like may be used in the present disclosure to describe various information, but the information should not be limited to these terms. These terms are only used to distinguish one type of information from another. For example, first information may also be referred to as second information, and similarly, second information may also be referred to as first information, without departing from the scope of the present disclosure. A word "if" as used herein may be interpreted as "in a case where . . . " . . . or "in response to that . . . ", which is based on the context.

The embodiments of the present disclosure provide a display panel, a display apparatus and a method for manufacturing the display panel. The display panel and the display apparatus in the embodiments of the present disclosure are described in detail below with reference to the accompanying drawings. The features of the embodiments described below may be complemented or combined with each other without conflict.

Referring to FIGS. 1 to 8, an embodiment of the present disclosure provides a QLED display panel 100, which includes a substrate 1, a first electrode layer 2, an electron transport layer 3, a light emitting layer 4, a hole transport layer 5, a hole injection layer 6, and a second electrode layer 7, which are sequentially stacked. A material of the hole injection layer 6 includes a first metal oxide and a second metal oxide, the first metal oxide and the second metal oxide contain the same metal element, but the number of outermost electrons of the metal element in the first metal oxide is different from the number of outermost electrons of the metal element in the second metal oxide, that is, a valence state of the metal element in the first metal oxide is different from a valence state of the metal element in the second metal oxide. In some implementations, the valence state of the metal element includes two or more of +2, +3, +4, +5, or +6. Specifically, the metal element may be molybdenum (Mo), tungsten (W) or vanadium (V), and correspondingly, the first metal oxide may be molybdenum oxide, tungsten oxide, or vanadium oxide. It should be noted that above oxides are merely general names. For example, for the molybdenum oxide, the metal element molybdenum may have a valence state of +4 or +6, that is, in the hole injection layer 6, the first metal oxide may be molybdenum trioxide ($MoO_3$), and the second metal oxide may be molybdenum dioxide ($MoO_2$). In some implementations, the first metal oxide in the hole injection layer 6 has a mass greater than that of the second metal oxide.

The material of the hole injection layer 6 further includes a metal M and a third metal oxide MOy ($0 \leq y \leq 3$, and y is a natural number or a decimal). A sum of masses of the metal M and the third metal oxide MOy is less than that of masses of the first metal oxide and the second metal oxide. In some implementations, a ratio of the mass of the metal M to the mass of the third metal oxide MOy is in a range from 3:1 to 5:1. A mass percentage of the metal M in the hole injection layer is in a range from 5% to 10%, and a mass percentage of the third metal oxide MOy in the hole injection layer is in a range from 1% to 5%.

In some implementations, referring to FIG. 1, the metal M, the third metal oxide MOy and the second metal oxide may be uniformly distributed in the first metal oxide, and the metal M, the third metal oxide Moy, the second metal oxide and the first metal oxide together form the hole injection layer 6, the valence state of the metal M is one or more of +1, +2, or +3.

In some implementations, the metal M has a higher chemical activity than the metal element in the first metal oxide, i.e., the metal M react with the oxygen more easily. Specifically, an oxidation-reduction reaction may occur between the metal M and the first metal oxide under a certain condition, the metal M loses electrons and undergoes an oxidation reaction to form the third metal oxide MOy, and the first metal oxide obtains the electrons and undergoes a reduction reaction to form the second metal oxide. That is, the second metal oxide and the third metal oxide MOy in the hole injection layer 6 are products generated by the oxidation-reduction reaction between the metal M and the first metal oxide. The metal M may include magnesium, aluminum, or silver, and correspondingly, the third metal oxide MOy may include magnesium oxide (MgO), aluminum oxide ($Al_2O_3$), or silver oxide (AgO). Specifically, by taking the first metal oxide as $MoO_3$ and the metal as Al as an example, the corresponding oxidation-reduction reaction formula is: $Al + MoO_3 \rightarrow Al_2O_3 + MoOy$ ($y \leq 3$).

In the related art, the material of the hole injection layer 6 includes $MoO_3$ with a fermi energy level of −5.48 eV, which is much lower than the energy level (e.g., −4.2 eV) of the second electrode layer 7, and thus an interface energy level barrier between the hole injection layer 6 and the second electrode layer 7 is too high, which results in difficulty in the hole injection and a too low hole transport rate in the QLED device. According to the present disclosure, the metal M is added into the hole injection layer 6 and the oxidation-reduction reaction occurs between the metal M and $MoO_3$ under a certain condition, to form the third metal oxide MOy and a molybdenum dioxide $MoO_2$ in a lower valence state or a reduced state, such that a work function of the molybdenum oxide in the hole injection layer 6 can be reduced. The reduction of the work function means a raising of the fermi energy level, which can reduce an interface contact barrier between the hole injection layer 6 and the second electrode layer 7, thereby causing the interface between the hole injection layer 6 and the second electrode layer 7 to be closer to an ohmic contact. In addition, the reduction of the valence state of Mo in $MoO_3$ means a raising in conductivity, and therefore electrons extracted from the hole transport layer 5 can more easily pass through the hole injection layer 6, to be transported to and collected by the second electrode layer 7, so that the hole injection ability is improved.

Figure 5:
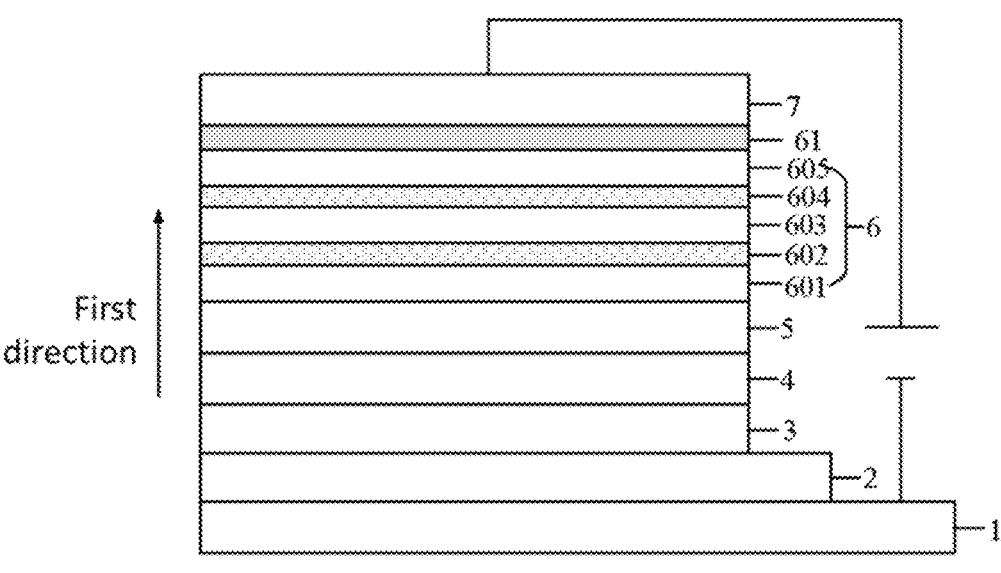
FIG. 5 is a schematic diagram of a structure of a display panel according to an exemplary embodiment of the present disclosure.

In some implementations, referring to FIGS. 1 and 5, one of the first electrode layer 2 and the second electrode layer 7 may be an anode or a cathode, and the other is a cathode or an anode accordingly, which may be adjusted and selected according to the type of the QLED device. Specifically, if the QLED device is in an inverted structure, the first electrode layer 2 is a cathode, and the second electrode layer 7 is an anode; if the QLED device is in a normal structure, the first electrode layer 2 is an anode and the second electrode layer 7 is a cathode. The first electrode layer 2 and the second electrode layer 7 may be transparent electrodes or opaque electrodes (reflective electrodes), and each may be made of a metal material such as aluminum, silver, gold, copper, or the like; or a transparent electrode material such as indium tin oxide (ITO), fluorine doped tin oxide (FTO), graphene, carbon nanotube film material, or the like.

In some implementations, the substrate 1 is a rigid substrate, which may be made of glass, metal, or the like. In some implementations, the substrate 1 may be a flexible substrate, which may be made of one or more of PI (polyimide), PET (polyethylene terephthalate), or PC (polycarbonate).

In some implementations, referring to FIG. 5, the hole injection layer 6 is of a multi-layer structure, and includes a first sub-layer 601 and a second sub-layer 603 sequentially disposed along a first direction, and a first reaction layer 602 disposed between the first sub-layer 601 and the second sub-layer 603. A material of the first sub-layer 601 includes the first metal oxide, a material of the second sub-layer 603 includes the metal M, and a material of the first reaction layer 602 includes the second metal oxide and the third metal oxide MOy. The first direction is a direction from the first electrode layer 2 to the second electrode layer 7.

In some implementations, the hole injection layer 6 further includes n sub-layers and n reaction layers alternatively disposed between the second sub-layer 603 and the second electrode layer 7, the n sub-layers are successively arranged at intervals and include different materials, the n reaction layers are successively arranged at intervals and include different materials, the second sub-layer 603 is closer to one of the n reaction layers than the n sub-layers, and n≥0 and n is an integer.

In some implementations, the materials of the n sub-layers include a metal and a metal oxide, which are different from the metal oxide of the first sub-layer 601 and the metal element of the second sub-layer 603; the materials of the n reaction layers includes a metal oxide, which is different from the material of the first reaction layer 602.

In some implementations, the materials of any two adjacent ones of the n sub-layers may be different, and the materials of any two adjacent ones of the n reaction layers may be different, the specific materials may be selected as desired.

In the embodiment of the present disclosure, the metal element in the first metal oxide has a chemical activity lower than that of the metal M. The first sub-layer 601 and the second sub-layer 603 may undergo an oxidation-reduction reaction at an interface therebetween to form the first reaction layer 602. Similarly, each of the n reaction layers is formed by an oxidation-reduction reaction between two adjacent ones of the n sub-layers at a contact interface therebetween.

In some implementations, a ratio of a thickness of the first sub-layer 601 and a thickness of the second sub-layer 603 is in a range from 2:1 to 10:1. Specifically, the thickness of the first sub-layer 601 is in a range from 5 nm to 10 nm, and the thickness of the second sub-layer 603 is in a range from 1 nm to 5 nm. The first sub-layer 601 and the second sub-layer 603 undergo the oxidation-reduction reaction at the interface therebetween, to form the first reaction layer 603 with a thickness in a range from 1 nm to 2 nm. The hole injection layer 6 may have a single-layer or multi-layer structure and a thickness in a range from 5 nm to 31 nm.

In some implementations, a roughness of the first reaction layer 602 is less than that of the first sub-layer 601, and a roughness of the n reaction layers is less than that of the n sub-layers. A carrier mobility of the first reaction layer 602 is greater than that of the first sub-layer 601.

An embodiment of the present disclosure further provides a display apparatus, which includes the display panel described above.

An embodiment of the present disclosure further provides a method for manufacturing an inverted QLED display panel, which includes: providing a substrate 1, and sequentially forming a first electrode layer 2, an electron transport layer 3, a light emitting layer 4, a hole transport layer 5, a hole injection layer 6 and a second electrode layer 7 on the substrate 1, the first electrode layer 2 serving as a cathode, and the second electrode layer 7 serving as an anode, a material of the hole injection layer 6 including a first metal oxide and a metal M; and applying a certain voltage between the first electrode layer 2 and the second electrode layer 7, so that an oxidation-reduction reaction occurs between the first metal oxide and the metal M in the hole injection layer 6 to form a second metal oxide and a third metal oxide MOy.

Various ways may be adopted to form the first metal oxide and the metal M, for example co-evaporating the first metal oxide and the metal M, sequentially evaporating the first metal oxide and the metal M in layers, or sequentially spin-coating the first metal oxide and the metal M.

As described above, the hole injection layer 6 provided by the embodiment of the present disclosure includes multiple components, and through the oxidation-reduction reaction, the interface contact between the hole injection layer 6 and the second electrode layer 7 is improved, and the carrier transmission rate at the interface between the hole injection layer 6 and the second electrode layer 7 is increased. Further, the metal is added into the hole injection layer 6, so that a transverse current of the hole injection layer 6 is greater, that is, the electric conduction and the heat conduction of the device are more uniform, thereby improving the light emitting efficiency of the device, reducing the power consumption of the device and improving the service life of the device.

Specific embodiments of the present disclosure will be described below by taking an example in which the first metal oxide is molybdenum trioxide ($MoO_3$, the valence state of Mo is +6), the second metal oxide is molybdenum dioxide ($MoO_2$, the valence state of Mo is +4), the metal M is magnesium (Mg) or aluminum (Al), and correspondingly, the third metal oxide is magnesium oxide (MgO) or aluminum oxide ($Al_2O_3$), and the material of the second electrode layer 7 is aluminum (Al).

First Embodiment

Referring to FIG. 1, an inverted QLED device is provided in the present embodiment, and includes: a substrate 1, a first electrode layer 2, an electron transport layer 3, a light emitting layer 4, a hole transport layer 5, a hole injection layer 6, and a second electrode layer 7, which are stacked sequentially. A material of the hole injection layer 6 includes a first metal oxide $MoO_3$ and a second metal oxide $MoO_2$, which contain the same metal element Mo with different valence states of +6 and +4, respectively. The material of the hole injection layer 6 further includes a small amount of metal Al and a third metal oxide $Al_2O_3$. A sum of masses of the metal Al and the third metal oxide $Al_2O_3$ is less than that of masses of the first metal oxide $MoO_3$ and the second metal oxide $MoO_2$. Specifically, a ratio of the sum of the masses of Al and $Al_2O_3$ to the total mass of the hole injection layer 6 is in a range from 1% to 5%.

Figure 2A:
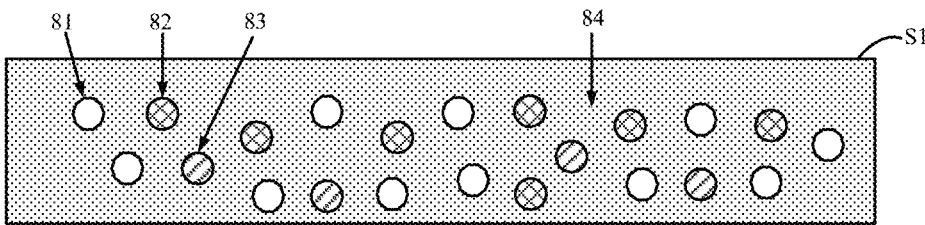
FIG. 2 is a schematic diagram of a structure of a hole injection layer in the embodiment shown in FIG. 1.
Figure 2B:
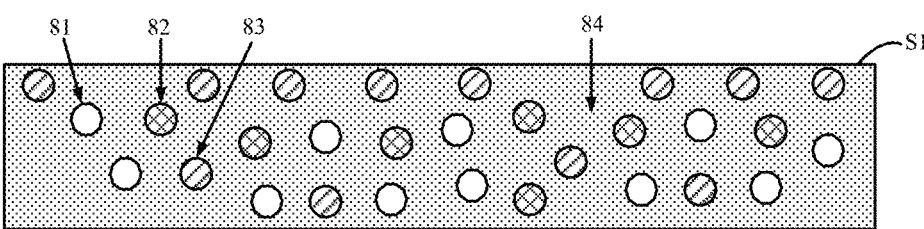

Referring to FIGS. 1 and 2, the hole injection layer 6 in the present embodiment has a single-layer structure, a host material of the hole injection layer 6 is the first metal oxide $MoO_3$ 84, and the metal Al 81, the third metal oxide $Al_2O_3$ 82 and the second metal oxide $MoO_2$ 83 are uniformly distributed in the first metal oxide; and the first metal oxide $MoO_3$ 84, the metal Al 81, the third metal oxide $Al_2O_3$ 82 and the second metal oxide $MoO_2$ 83 together form the hole injection layer 6. The metal Al and the first metal oxide $MoO_3$ may be deposited on a side of the hole transport layer 5 away from the light emitting layer 4 by co-evaporation. Under a certain condition, with reference to FIGS. 2a and 2b, an oxidation-reduction reaction may occur between the metal Al and the first metal oxide $MoO_3$, that is, the Al loses electrons and undergoes an oxidation reaction to form the third metal oxide $Al_2O_3$, the first metal oxide $MoO_3$ obtains the electrons and undergoes a reduction reaction to form the second metal oxide $MoO_2$, thus the third metal oxide $Al_2O_3$ and the second metal oxide $MoO_2$ in the hole injection layer 6 are formed through the chemical reaction between the first metal oxide $MoO_3$ and the metal Al. In addition, the hole injection layer 6 may alternatively be formed by co-evaporating the metal Al, the first metal oxide $MoO_3$, and the second metal oxide $MoO_2$, which has the same principle as the manner described above and is not described herein again.

In this embodiment, since the material of the second electrode layer 7 is Al which may react with the first metal oxide $MoO_3$, as shown in FIG. 2a, a concentration of the second metal oxide $MoO_2$ 83 is higher at an S1 interface of the hole injection layer 6 close to the second electrode layer 7.

Second Embodiment

Figure 3:
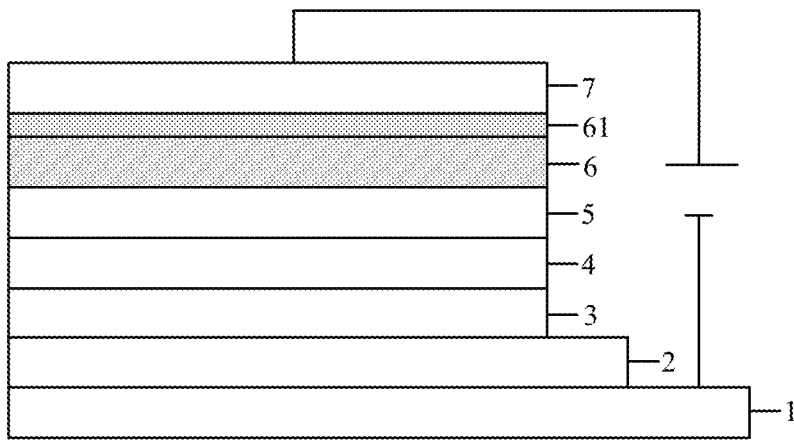
FIG. 3 is a schematic diagram of a structure of a display panel according to an exemplary embodiment of the present disclosure.
Figure 4:
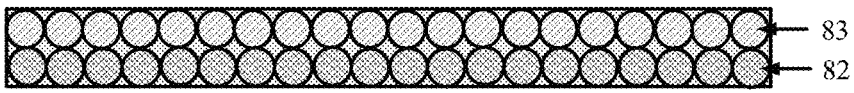
FIG. 4 is a schematic diagram of a structure of a first reaction layer in the embodiment shown in FIG. 3.

Referring to FIGS. 3 and 4, compared with the first embodiment, in this embodiment, the metal M in the hole injection layer 6 is magnesium (Mg), which undergoes an oxidation-reduction reaction with the first metal oxide $MoO_3$ to form the third metal oxide MgO and the second metal oxide $MoO_2$, that is, the material of the hole injection layer 6 includes the first metal oxide $MoO_3$, the second metal oxide $MoO_2$, the metal Mg, and the third metal oxide MgO. Further, the second reaction layer 61 is further provided between the hole injection layer 6 and the second electrode layer 7, and the material of the second reaction layer 61 includes $Al_2O_3$ 83 and the second metal oxide $MoO_2$ 82. The second electrode layer 7 is made of Al and undergoes an oxidation-reduction reaction with the first metal oxide $MoO_3$, and therefore, if there is the residue unreacted first metal oxide $MoO_3$ at the interface of the hole injection layer 6 close to the second electrode layer 7, the residue unreacted first metal oxide $MoO_3$ may be subjected to an oxidation-reduction reaction with the second electrode layer 7 to form $Al_2O_3$ 83 and the second metal oxide $MoO_2$ 82, thereby forming the second reaction layer 61. A thickness of the second reaction layer 61 is in a range from 1 nm to 2 nm, and for example, may be equal to 1 nm.

Third Embodiment

Referring to FIG. 5, the hole injection layer 6 has a multi-layer structure, including the first sub-layer 601 and the second sub-layer 603 sequentially disposed along the first direction, and the first reaction layer 602 disposed between the first sub-layer 601 and the second sub-layer 603. A material of the first sub-layer 601 includes the first metal oxide $MoO_3$, a material of the second sub-layer 603 includes the metal Al, and a material of the first reaction layer 602 includes the second metal oxide $MoO_2$ and the third metal oxide $Al_2O_3$. The first direction is a direction from the first electrode layer 2 to the second electrode layer 7.

Further, the hole injection layer 6 further includes n sub-layers and n reaction layers alternatively disposed between the second sub-layer 603 and the second electrode layer 7, the n sub-layers are successively arranged at intervals and include different materials, the n reaction layers are successively arranged at intervals and include different materials, the second sub-layer 603 is close to one of the n reaction layers than the n sub-layers, and n≥0 and n is an integer. Referring to FIG. 5, in a case where n=1, the hole injection layer 6 includes one sub-layer and one reaction layer between the second sub-layer 603 and the second electrode layer 7.

In this embodiment, as shown in FIG. 5, the materials of the sub-layer 605 and the first sub-layer 602 are the same, and both are $MoO_3$. Accordingly, the materials of the reaction layer 604 and the first reaction layer 602 are the same, and include the second metal oxide $MoO_2$ and the third metal oxide $Al_2O_3$.

Referring to FIG. 6, in this embodiment, a plurality of sub-layers and a plurality of reaction layers alternatively disposed may be arranged between the second sub-layer 603 and the second electrode layer 7, the sub-layers are successively arranged at intervals, and the reaction layers are successively arranged at intervals, each reaction layer 604 is made of the same material, and materials of any adjacent sub-layers are respectively $MoO_3$ and Al.

Fourth Embodiment

Referring to FIGS. 7 and 8, the present embodiment is different from the third embodiment in that the materials of any two adjacent sub-layers with a reaction layer therebetween are not the same, and the materials of any two adjacent reaction layers with a sub-layer therebetween are not the same. In this embodiment, the material of any sub-layer 605 may be $WO_3$, and accordingly, the material of the reaction layer 604 formed is different from the material of the first reaction layer 602.

Fifth Embodiment

Figure 9:
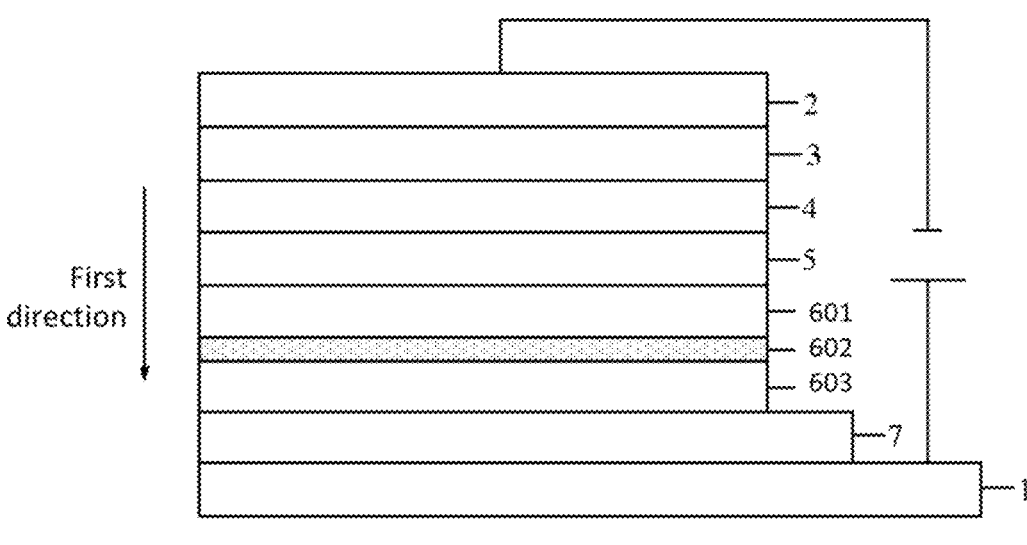
FIG. 9 is a schematic diagram of a structure of a display panel according to an exemplary embodiment of the present disclosure.

Referring to FIG. 9, a normal QLED device is provided in the present embodiment, and mainly includes: a substrate 1, a second electrode layer 7, a hole injection layer 6, a hole transport layer 5, an electron transport layer 3, and a first electrode layer 2, which are sequentially stacked. The hole injection layer 6 has a multi-layer structure, and sequentially includes a second sub-layer 603, a first reaction layer 602, and a first sub-layer 601 in a direction away from the substrate 1. Specifically, a material of the second sub-layer 603 is a metal Al, a material of the first sub-layer 601 is $MoO_3$, and a material of the first reaction layer 602 is $MoO_2$ and $Al_2O_3$. The second sub-layer 603 and the first sub-layer 601 are sequentially formed by spin-coating.

Sixth Embodiment

Figure 10:
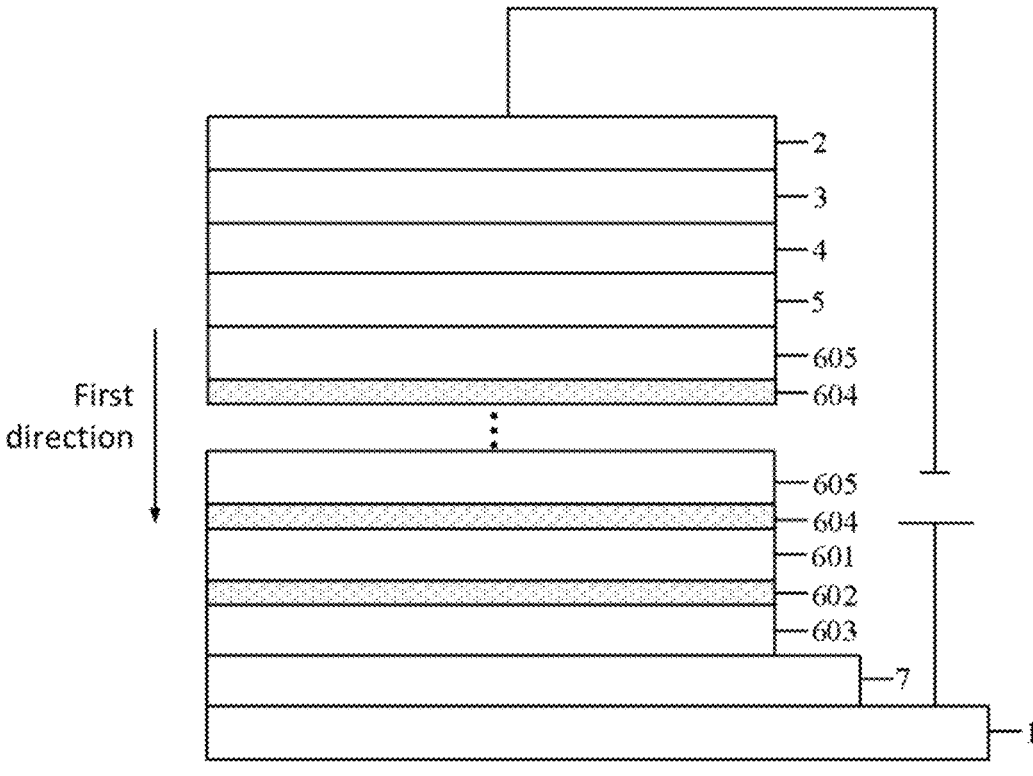
FIG. 10 is a schematic diagram of a structure of a display panel according to anr exemplary embodiment of the present disclosure.

Referring to FIG. 10, compared with the fifth embodiment, in this embodiment, the hole injection layer 6 further includes a plurality of sub-layers and a plurality of reaction layers disposed between the first sub-layer 601 and the first electrode layer 2. Materials of the sub-layers may be not the same, for example, the materials of the sub-layers 604 may be sequentially $V_2O_5$, $WO_3$, $MoO_3$.

Seventh Embodiment

Figure 11:
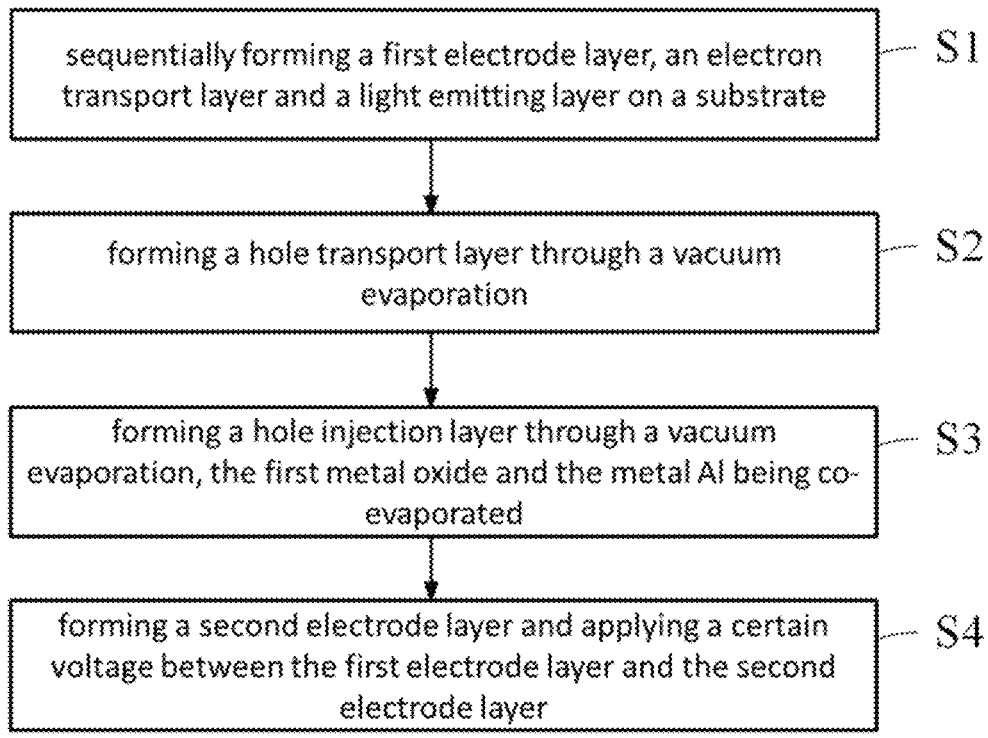
FIG. 11 is a flowchart of a method for manufacturing a display panel according to an exemplary embodiment of the present disclosure.

Referring to FIG. 11, this embodiment provides a method for manufacturing an inverted QLED display panel according to the first embodiment, including following steps S1 to S4.

S1, providing a substrate 1, and sequentially forming a first electrode layer 2, an electron transport layer 3 and a light emitting layer 4 on the substrate 1.

S2, forming a hole transport layer 5 on the light emitting layer 4 through a vacuum evaporation under the following experimental conditions that a vacuum degree is less than or equal to $10^{-4}$ Pa, and an evaporation rate is between 0.5 Å/s and 0.8 Å/s. The hole transport layer 5 may include an organic hole transport material, such as PVK (polyvinylcarbazole), TFM (poly (9,9-dioctylfluorene-CO—N-(4-butylphenyl) diphenylamine)), TPD (N,N'-diphenyl-N,N'-Mis(3-methyllphenyl)-(1,1'-Miphenyl)-4,4-diamine) and derivatives thereof; or an inorganic hole transport material, such as nickel oxide (NiOy) and vanadium oxide (VOy). A thickness of the hole transport layer 5 is in a range from 10 nm to 60 nm.

S3, forming a hole injection layer 6 through a vacuum evaporation, specifically, depositing the first metal oxide $MoO_3$ and the metal Al on the hole transport layer 5 by co-evaporation under the following experimental conditions that a vacuum degree is less than or equal to $10^{-4}$ Pa, and an evaporation rate is between 0.1 Å/s and 0.5 Å/s. The hole injection layer 6 is of a single-layer structure, and a mass percentage of the metal Al is in a range from 5% to 10%.

S4, forming a second electrode layer 7 on the hole injection layer 6. By applying a certain voltage (for example, in a range from 2V to 6V) between the first electrode layer 2 and the second electrode layer 7, the first metal oxide $MoO_3$ and the metal Al in the hole injection layer 6 undergo an oxidation-reduction reaction to form a second metal oxide $MoO_2$ and a third metal oxide $Al_2O_3$, and a mass percentage of the $Al_2O_3$ is in a range from 1% to 5%.

Eighth Embodiment

Figure 12:
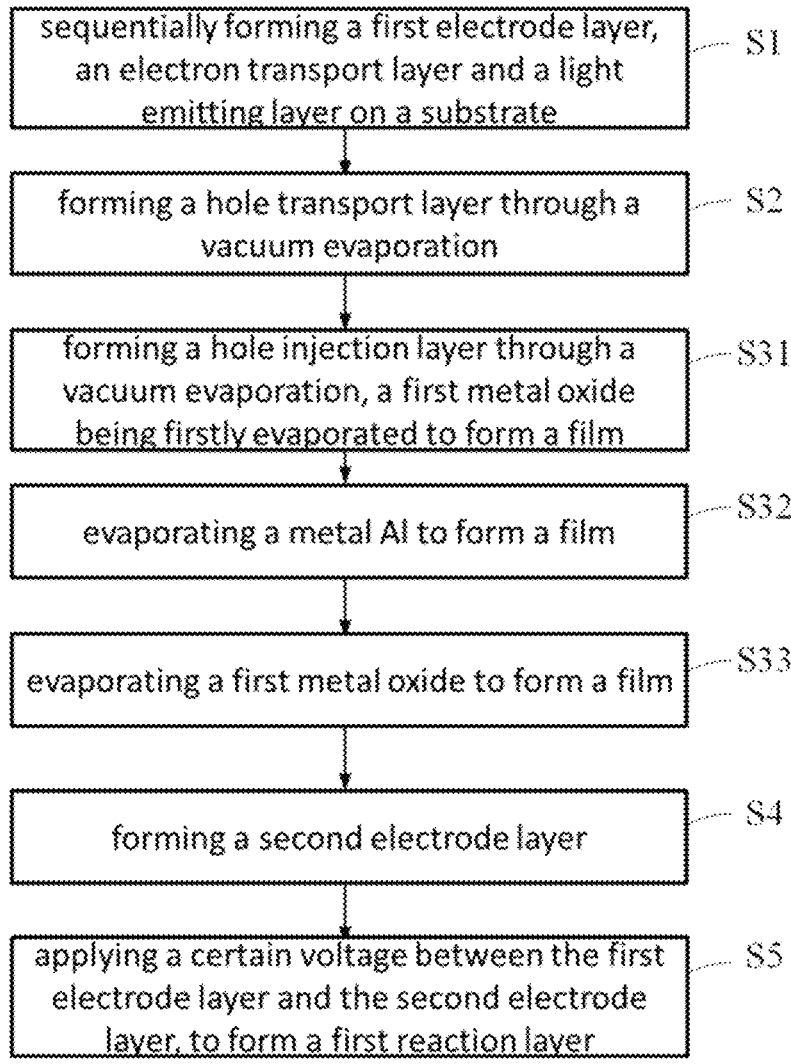
FIG. 12 is a flowchart of a method for manufacturing a display panel according to an exemplary embodiment of the present disclosure.

Referring to FIG. 12, compared with the seventh embodiment, in this embodiment, the hole injection layer 6 is of a multi-layer structure, and accordingly, the method for manufacturing the display panel further includes following steps S31 to S5

S31, after forming the hole transport layer 5, evaporating a first metal oxide $MoO_3$ with a thickness in a range from 1 nm to 30 nm on the hole transport layer 5 under the following experimental conditions that a vacuum degree is less than or equal to $10^{-4}$ Pa, and an evaporation rate is between 0.1 Å/s and 0.5 Å/s, S32, evaporating a metal Al with a thickness in a range from 1 nm to 30 nm on the first metal oxide $MoO_3$ under the following experimental conditions that a vacuum degree is less than or equal to $10^{-4}$ Pa, and an evaporation rate is between 1.2 Å/s and 2.0 Å/s, S33, evaporating a first metal oxide $MoO_3$ with a thickness in a range from 1 nm to 30 nm on the metal Al.

S4, forming a second electrode layer 7,

S5, applying a certain voltage (for example, in a range from 2V to 6V) between the first electrode layer 2 and the second electrode layer 7, so that the first metal oxide $MoO_3$ and the metal Al in the hole injection layer 6 adjacent to each other undergo an oxidation-reduction reaction to form the second metal oxide $MoO_2$ and the third metal oxide $Al_2O_3$, thereby forming a first reaction layer.

In some implementations, the metal oxides deposited in steps S2 and S4 are different, for example, $MoO_3$ is deposited in step S2 and $WO_3$ is deposited in step S4, the first reaction layer and the reaction layers include different materials.

Ninth Embodiment

Figure 13:
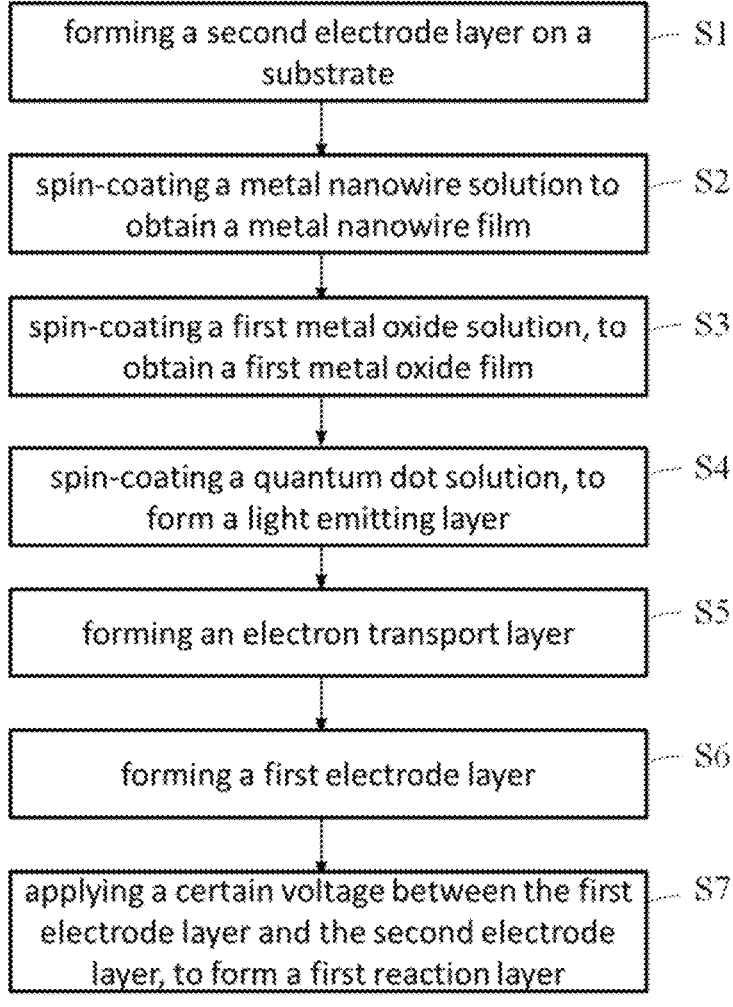
FIG. 13 is a flowchart of a method for manufacturing a display panel according to an exemplary embodiment of the present disclosure.

Referring to FIG. 13, this embodiment provides a method for manufacturing a normal QLED device as described in the third embodiment, including following steps S1 to S6.

S1, forming a second electrode layer 7 on a substrate.

S2, spin-coating a metal nanowire solution on the second electrode layer 7 under the following experimental conditions that a rotate speed is 3000 r/min, a duration is 40 s, to obtain a metal nanowire film with a thickness in a range from 5 nm to 10 nm.

S3, spin-coating a first metal oxide solution (e.g., a molybdenum oxide solution) on the metal nanowire film under the following experimental conditions that a rotate speed is in a range from 2000 r/min to 3000 r/min, a duration is 40 s, to obtain a first metal oxide film with a thickness in a range from 5 nm to 10 nm.

S4, spin-coating a quantum dot solution on the first metal oxide film to form a light emitting layer with a thickness in a range from 20 nm to 40 nm.

S5, forming an electron transport layer with a thickness in a range from 10 nm to 60 nm by spin-coating on the light emitting layer.

S6, evaporating a first electrode layer with a thickness in a range from 80 nm to 120 nm on the electron transport layer.

Tenth Embodiment

Referring to FIG. 14, in this embodiment, for the method in any one of the seventh to ninth embodiments, the method further includes: after a certain voltage is applied between the first electrode layer and the second electrode layer, performing a UV irradiation process on the display panel, with a power of the UV being in a range from 1 mW to 100 mW, and a duration of process being in a range from 1 minute to 20 minutes, so that the oxidation-reduction reaction between the first metal oxide MoO$_3$ and the metal Al is promoted.

Eleventh Embodiment

Figure 15B:
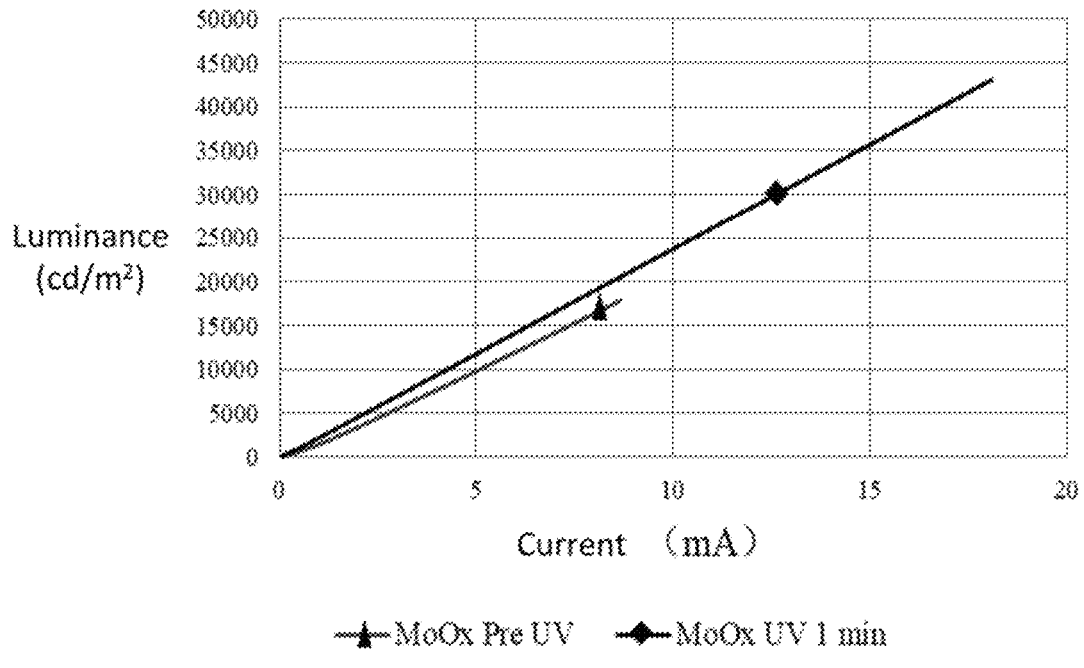
FIG. 15b is a comparison graph for a relationship between a current and a luminance of a display panel before and after a UV irradiation process according to an exemplary embodiment of the present disclosure.
Figure 15C:
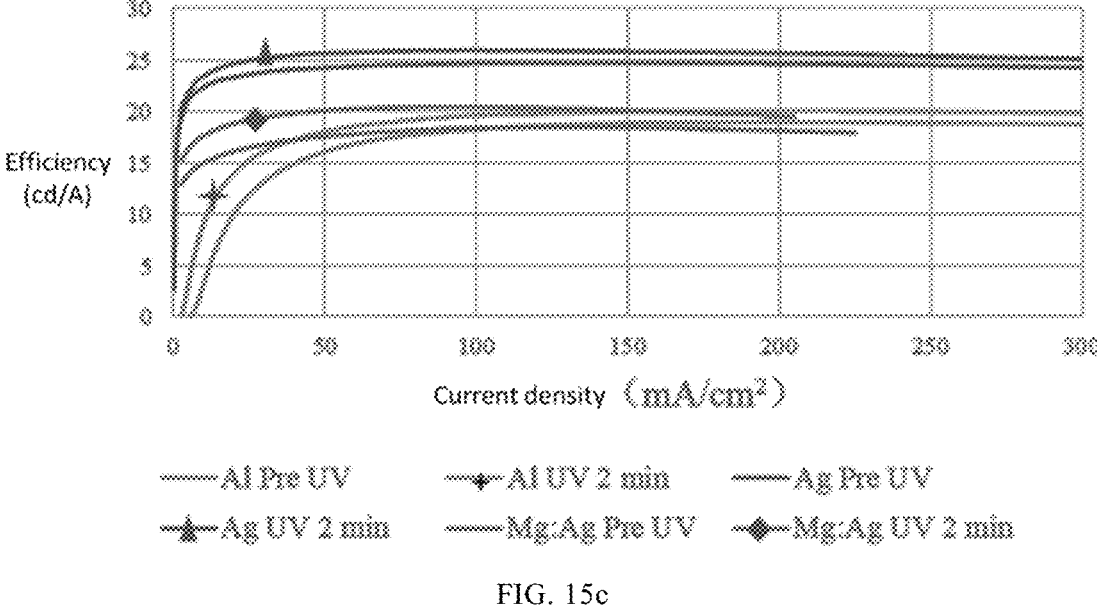
FIG. 15c is a comparison graph for a relationship between a current density and a device efficiency of a display panel before and after a UV irradiation process in a case where a first or second electrode layer is made of different metal materials according to an exemplary embodiment of the present disclosure.
Figure 16:
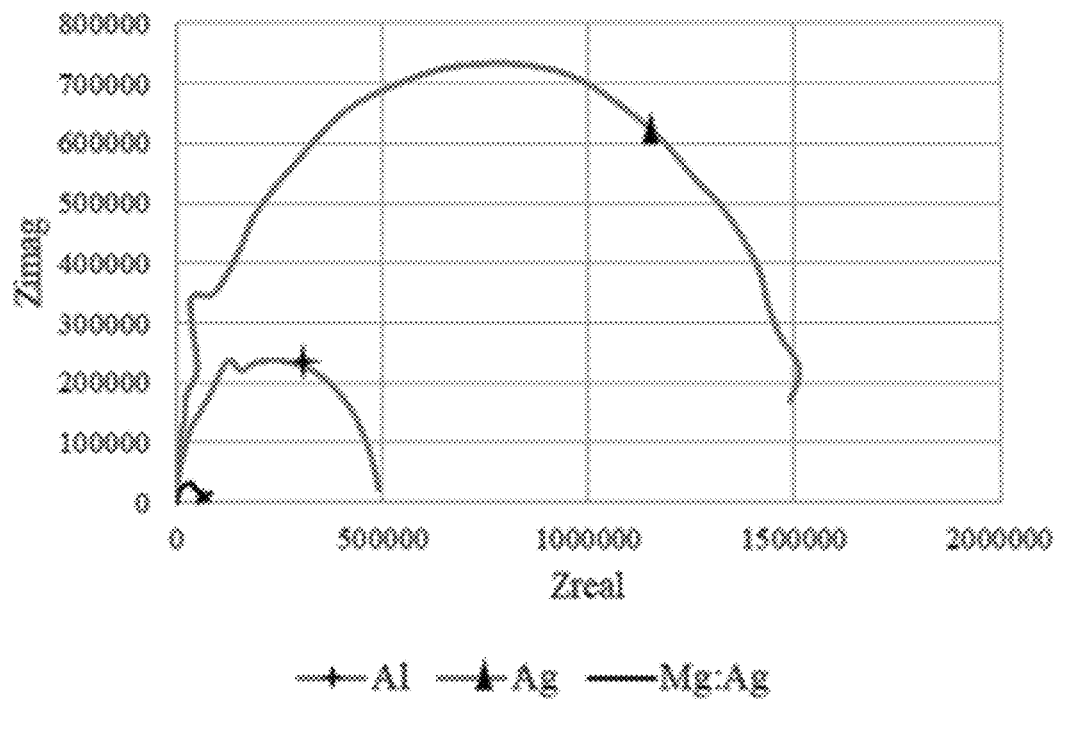
FIG. 16 is an impedance spectrum of a display panel manufactured in a case where a first or second electrode layer is made of different metal materials according to an exemplary embodiment of the present disclosure.

Referring to FIGS. 1 and 3, the QLED device structure described in the first embodiment or the second embodiment is employed in the present embodiment. Specifically, the hole injection layer 6 is of a single-layer structure; or the hole injection layer 6 may undergo an oxidation-reduction reaction with the second electrode layer 7, to form the second reaction layer 61, the second electrode layer 7 is a metal electrode, and may be made of one or more of Al, Ag, or Mg:Ag. FIGS. 15a and 15b are comparison graphs for a relationship between a current and a device efficiency and a relationship between a current and a luminance of a display panel before and after a UV irradiation process, respectively. It can be seen from FIGS. 15a and 15b that the display panel is irradiated for 1 minutes by the UV, so that the device efficiency is improved, and the brightness is increased under the same current. FIG. 15c is a comparison graph for a relationship between a current density and a device efficiency of a display panel before and after a UV irradiation process in cases where the second electrode layer is made of different metal materials. It can be seen from FIG. 15c that after the irradiation by the UV for 2 minutes, the device efficiency is improved to some extent. FIG. 16 is an impedance spectrum of a display panel manufactured in cases where the second electrode layer is made of different metal materials. It can be seen that under the same voltage, the resistance is the smallest in a case where the Mg:Ag electrode is used, and the resistance is the largest in a case where the Ag electrode is used, which indicates that different metal electrodes have different effects on the current and the device efficiency.

Twelfth Embodiment

Figure 17A:
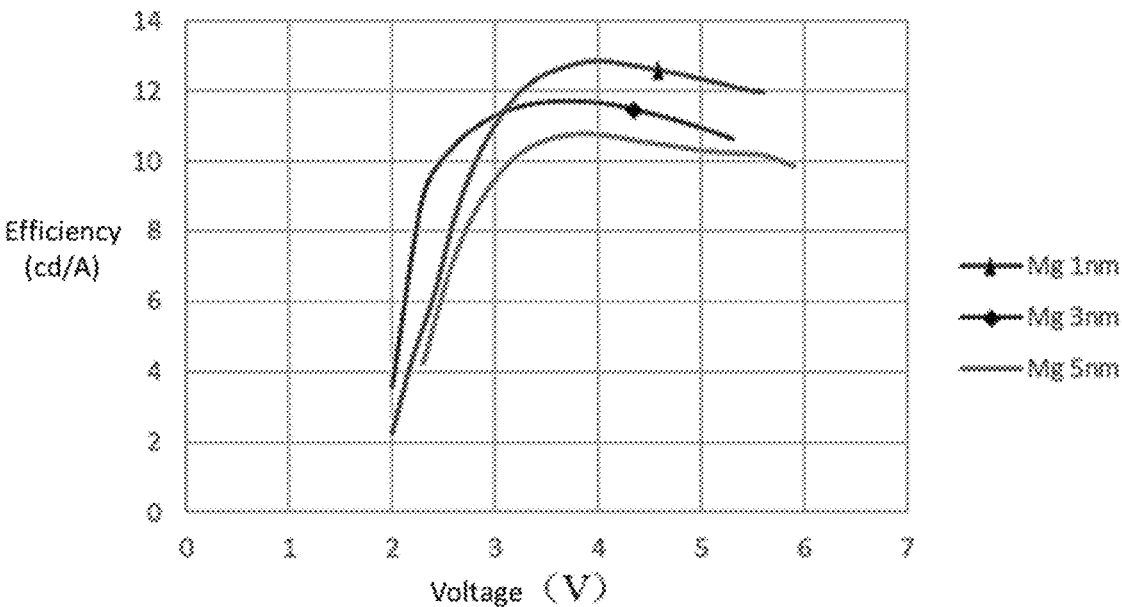
FIG. 17a is a comparison graph for a relationship between a thickness of a second sub-layer of a hole injection layer and a device efficiency in a case where the second sub-layer is made of Mg according to some implementations of the present disclosure.
Figure 17B:
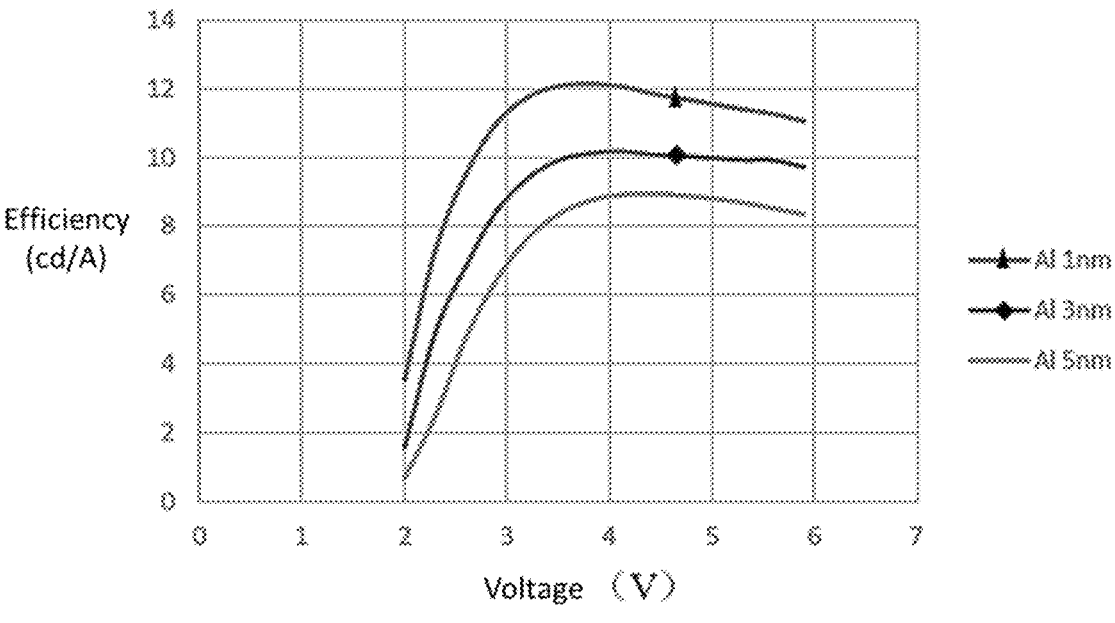
FIG. 17b is a comparison graph for a relationship between a thickness of a second sub-layer of a hole injection layer and a device efficiency in a case where the second sub-layer is made of Al according to some implementations of the present disclosure.
Figure 17C:
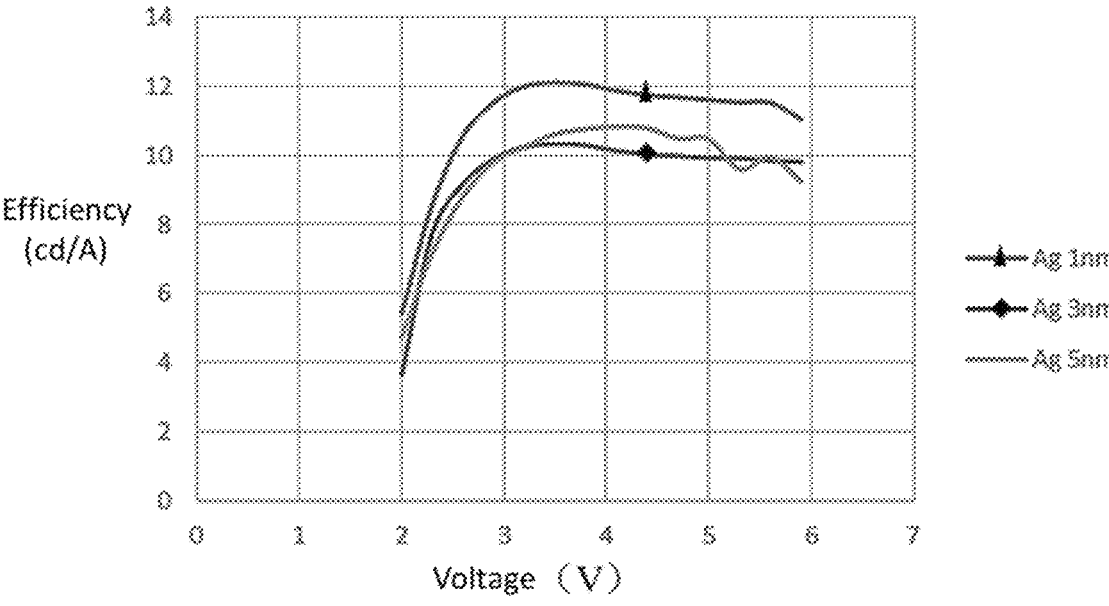
FIG. 17c is a comparison graph for a relationship between a thickness of a second sub-layer of a hole injection layer and a device efficiency in a case where the second sub-layer is made of Ag according to some implementations of the present disclosure.
Figure 17D:
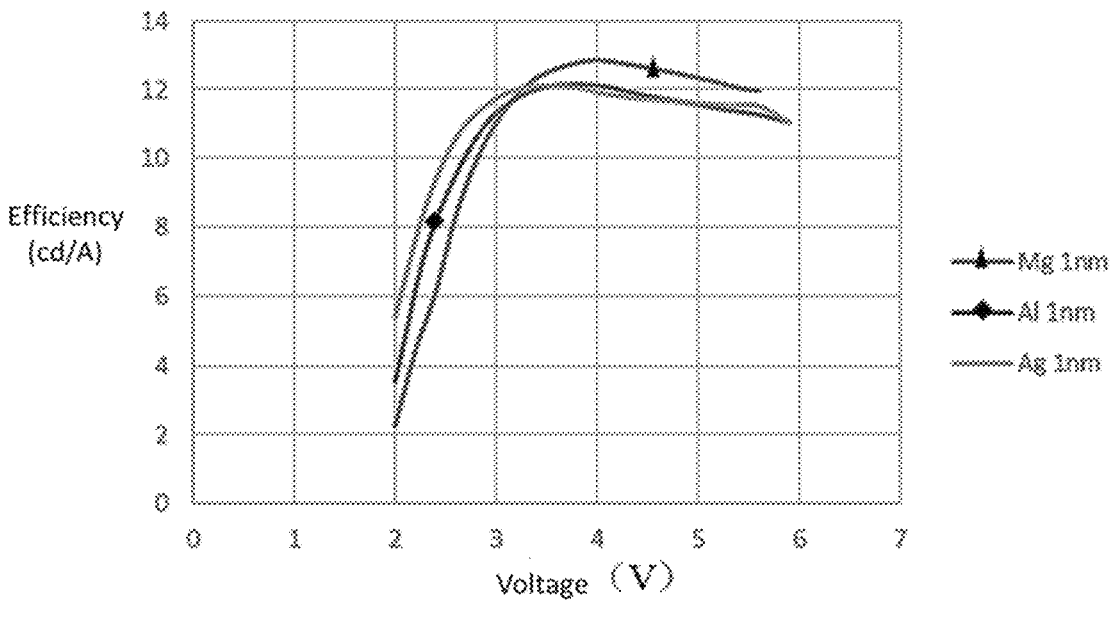
FIG. 17d is a comparison graph for a relationship between a material type of a second sub-layer of a hole injection layer and a device efficiency in a case where the second sub-layer has a thickness of 1 nm according to some implementations of the present disclosure.
Figure 17E:
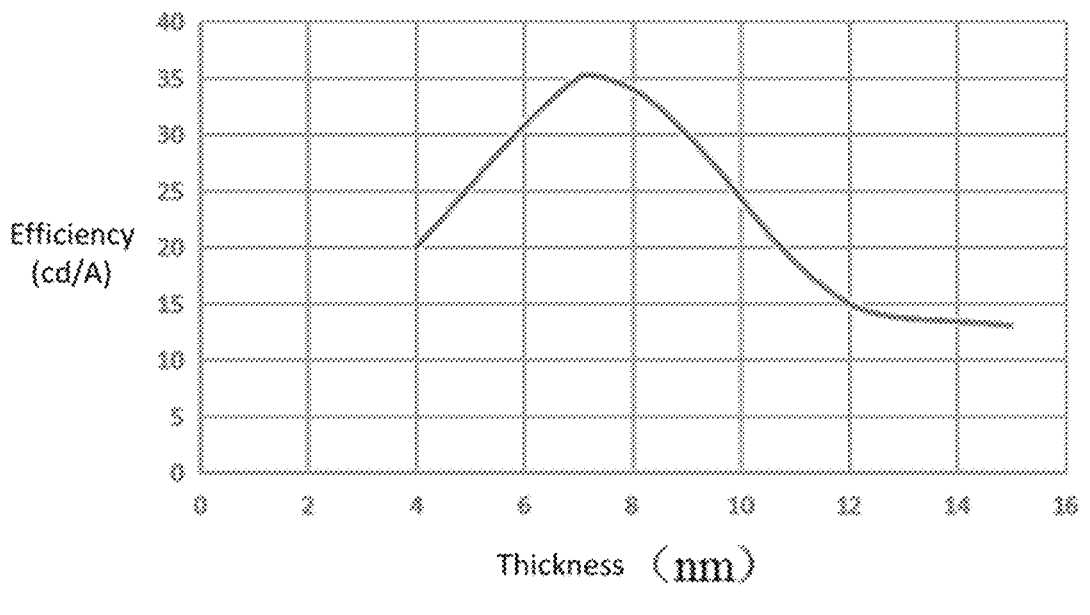
FIG. 17e is a comparison graph for a relationship between a thickness of a hole injection layer and a device efficiency according to some implementations of the present disclosure.

Referring to FIGS. 5 and 8, the QLED device structure described in the third embodiment or the fifth embodiment is employed in the present embodiment. Specifically, the hole injection layer 6 is of a multi-layer structure, and includes the first sub-layer 601, the first reaction layer 602 and the second sub-layer 603, the material of the first sub-layer 601 is MoO$_3$, the material of the second sub-layer 603 is any one of Mg, Al or Mg, and the thickness of the first sub-layer 601 is in a range from 1 nm to 10 nm, for example, may be equal to 5 nm. The thickness of the second sub-layer 603 is in a range from 1 nm to 10 nm, and specifically, may be 1 nm, 3 nm, or 5 nm. FIGS. 17a to 17c show graphs for a device efficiency as a function of a thickness of the second sub-layer 603 made of different materials, respectively, with the abscissa representing a voltage (in volts (V)) and the ordinate representing a device efficiency (in candelas/amps (cd/A)) of the display panel. Experimental results show that the device efficiency in each of FIGS. 17a to 17c has a tendency of firstly increasing and then decreasing in a case where the voltage is increased from 2V to 6V, and in addition, the device efficiency is inversely proportional to the thickness of the second sub-layer 603, i.e., the device efficiency decreases as the thickness of the second sub-layer 603 increases, and thus the device efficiency is highest in a case where the thickness of the second sub-layer 603 is equal to 1 nm. Referring to FIG. 17d, in a case where the thickness of the second sub-layer 603 is equal to 1 nm, the device efficiency is relatively higher in a case where the second sub-layer 603 is made of Mg. FIG. 17e shows a graph for a device efficiency as a function of a thickness of the first sub-layer MoO$_3$, with the abscissa representing a thickness (in nanometers (nm)) and the ordinate represents a device efficiency (in candelas/amps (cd/A)) of the display panel. Experimental results show that in a case where the thickness of the first sub-layer is in a range from 5 nm to 7 nm, the device efficiency is relatively high.

Thirteenth Embodiment

Figure 18:
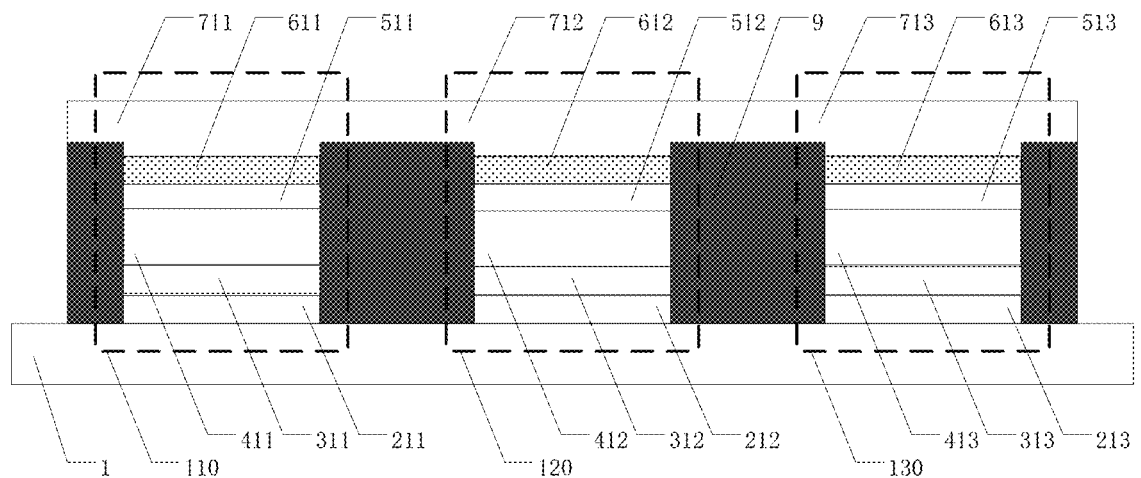
FIG. 18 is a schematic diagram of a display apparatus according to an exemplary embodiment of the present disclosure.
Figure 19:
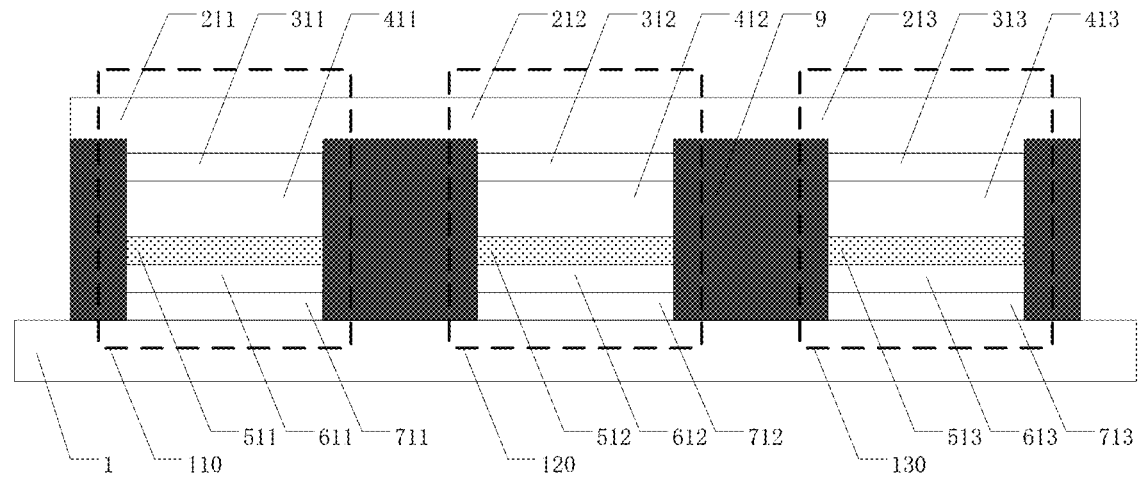
FIG. 19 is a schematic diagram of a display apparatus according to an exemplary embodiment of the present disclosure.

FIGS. 18 and 19 show the overall structures of the inverted QLED device and the normal QLED device, respectively. Referring to FIG. 18, the inverted QLED device includes a first light emitting element 110, a second light emitting element 120, and a third light emitting element 130, which may be configured to emit light of different colors. In some implementations, the first light emitting element 110 may emit red light, the second light emitting element 120 may emit green light, and the third light emitting element 130 may emit blue light. The first light emitting element 110 includes a first light emitting layer 411, a first electron transport layer 311, and a first electrode layer 211; the first electrode layer 211 is in contact with the first electron transport layer 311; and the first electrode layer 211 is configured to supply electrons during the first light emitting element 110 emitting light.

In some examples, the first light emitting layer 411 may be a red quantum dot light emitting layer, and may be made of cadmium selenide (CdSe), a CdSe/ZnS core-shell quantum dot material; or may be alternatively made of a cadmium-free quantum dot material, such as indium phosphide (InP), a InP/ZnS core-shell quantum dot material, to reduce a pollution to an environment.

In some examples, the display apparatus may be any product or component having a display function, such as a smart phone, a tablet computer, a television, a display, a notebook computer, a digital photo frame, a navigator or the like.

It is noted that in the drawings, sizes of layers and regions may be exaggerated for clarity of illustration. Also, it will be understood that if an element or layer is referred to as being "on" another element or layer, it may be directly on another element or intervening layers may be present therebetween. In addition, it will be understood that if an element or layer is referred to as being "under" another element or layer, it may be directly under another element or intervening layers or elements may be present therebetween. In addition, it will also be understood that if a layer or element is referred to as being "between" two layers or elements, it may be the only layer between the two layers or elements, or intervening layers or elements may be present between the two layers or elements. Like reference numerals refer to like elements throughout the description.

Some implementations of the present disclosure will be apparent to ordinary skills in the art from considering the specification and putting the present disclosure disclosed herein into practices. The present disclosure is intended to cover any variations, uses, or adaptations of the present disclosure following the generalized principle of the present disclosure and including the common general knowledge or the conventional technical means in the related art, which is not disclosed by the present disclosure. The specification and the embodiments are considered as exemplary only, and a true scope of the present disclosure is indicated by the appended claims.

It will be understood that the present disclosure is not limited to the precise arrangements that have been described above and shown in the drawings, and various modifications and changes may be made without departing from the scope of the present disclosure. The scope of the present disclosure is limited only by the appended claims.

What is claimed is:

1. A display panel, comprising:
a first electrode layer, an electron transport layer, a light emitting layer, a hole transport layer, a hole injection layer, and a second electrode layer, which are sequentially stacked,
wherein a material of the hole injection layer comprises a first metal oxide and a second metal oxide, the first metal oxide and the second metal oxide contain a same metal element, and a total number of outermost electrons of the metal element of the first metal oxide is different from a total number of outermost electrons of the metal element of the second metal oxide,
wherein the material of the hole injection layer further comprises a metal M and a third metal oxide $MO_y$, $0<y\leq3$, where y is a natural number or a decimal.

2. The display panel according to claim 1, wherein a sum of masses of the metal M and the third metal oxide $MO_y$ is less than a sum of masses of the first metal oxide and the second metal oxide.

3. The display panel according to claim 2, wherein a ratio of the mass of the metal M to the mass of the third metal oxide $MO_y$ is in a range from 3:1 to 5:1.

4. The display panel according to claim 3, wherein a mass percentage of the metal M in the hole injection layer is in a range from 5% to 10%, and a mass percentage of the third metal oxide $MO_y$ in the hole injection layer is in a range from 1% to 5%.

5. The display panel according to claim 3, wherein the hole injection layer is of a multi-layer structure, and comprises a first sub-layer and a second sub-layer sequentially arranged along a first direction and a first reaction layer between the first sub-layer and the second sub-layer, wherein a material of the first sub-layer comprises the first metal oxide, a material of the second sub-layer comprises the metal M, and a material of the first reaction layer comprises the second metal oxide and the third metal oxide $MO_y$.

6. The display panel according to claim 5, wherein a ratio of a thickness of the first sub-layer and a thickness of the second sub-layer is in a range from 2:1 to 10:1, wherein the first sub-layer has a thickness in a range from 5 nm to 10 nm, the second sub-layer has a thickness in a range from 1 nm to 5 nm, and the first reaction layer has a thickness in a range from 1 nm to 2 nm.

7. The display panel according to claim 5, wherein the first reaction layer has a carrier mobility greater than that of the first sub-layer.

8. The display panel according to claim 5, wherein the hole injection layer further comprises n sub-layers and n reaction layers alternately arranged between the second sub-layer and the second electrode layer, the n sub-layers are successively arranged at intervals, the n reaction layers are successively arranged at intervals, the second sub-layer is closer to one of the n reaction layers than the n sub-layers, and n is greater than or equal to 0 and is an integer.

9. The display panel according to claim 8, wherein a material of the n sub-layers comprises a metal and a metal oxide, and is different from the materials of the first sub-layer and the second sub-layer; the material of the n reaction layers comprises a metal oxide, and is different from material of the first reaction layer,
wherein the n sub-layers comprise different materials and the n reaction layers comprise different materials.

10. The display panel according to claim 8, wherein the first reaction layer has a roughness less than that of the first sub-layer, and each of the n reaction layers has a roughness less than that of each of the n sub-layers.

11. The display panel according to claim 8, wherein a metal element in the first metal oxide has a chemical activity lower than that of the metal M,
wherein the first reaction layer is formed by an oxidation-reduction reaction between the first sub-layer and the second sub-layer, and each of the n reaction layers is formed by an oxidation-reduction reaction between adjacent ones of the n sub-layers.

12. The display panel according to claim 1, wherein a metal element in the first metal oxide comprises at least one of molybdenum, vanadium, or tungsten.

13. The display panel according to claim 1, wherein the metal M comprises at least one of magnesium, aluminum, copper or silver.

14. The display panel according to claim 1, wherein the first electrode layer is a cathode and the second electrode layer is an anode; or the first electrode layer is an anode and the second electrode layer is a cathode; and each of the first electrode layer and the second electrode layer is made of at least one of silver, aluminum, indium tin oxide, or carbon nanotubes.

15. The display panel according to claim 1, wherein the hole injection layer has a thickness in a range from 5 nm to 31 nm.

16. A display apparatus, comprising the display panel according to claim 1.

17. A method for manufacturing a display panel, comprising:
providing a substrate, and sequentially forming a first electrode layer, an electron transport layer, a light emitting layer, a hole transport layer, a hole injection layer and a second electrode layer on the substrate, a material of the hole injection layer comprising a mixture of a first metal oxide and a metal M; and
applying a voltage between the first electrode layer and the second electrode layer, so that the first metal oxide and the metal M undergo an oxidation-reduction reaction to form a second metal oxide and a third metal oxide $MO_y$, $0<y\leq3$, where y is a natural number or a decimal, the second metal oxide and the third metal oxide being within the hole injection layer, the first metal oxide and the second metal oxide containing a same metal element, a total number of outermost electrons of the metal element of the first metal oxide being different from a total number of outermost electrons of the metal element of the second metal oxide, and the voltage being an operating voltage of the display panel.

18. The method according to claim 17, further comprising:

performing a UV irradiation process on the display panel after the voltage is applied between the first electrode layer and the second electrode layer; wherein a power of the UV is in a range from 1 mW to 100 mW, and a duration of the UV irradiation process is in a range from 1 minute to 20 minutes.

19. The method according to claim 17, further comprising:

depositing the first metal oxide and the metal M on the hole transport layer by co-evaporation, wherein the metal M, the second metal oxide, and the third metal oxide are uniformly distributed in the first metal oxide, or, depositing the metal M in a form of a metal nanowire on the hole transport layer by spin-coating, and depositing the first metal oxide on a side of the metal M away from the hole transport layer by spin-coating.

* * * * *